(12) United States Patent
Li et al.

(10) Patent No.: US 11,165,038 B2
(45) Date of Patent: Nov. 2, 2021

(54) DISPLAY MODULE AND ELECTRONIC DEVICE WITH AUXILIARY ELECTRODE LAYER ON CATHODE LAYER

(71) Applicant: WUHAN CHINA STAR OPTOELECTRONICS TECHNOLOGY CO., LTD, Hubei (CN)

(72) Inventors: Xueyun Li, Hubei (CN); Yuejun Tang, Hubei (CN); Jing Cai, Hubei (CN); Junjie Huang, Hubei (CN); Hui Zhou, Hubei (CN)

(73) Assignee: WUHAN CHINA STAR OPTOELECTRONICS TECHNOLOGY CO., LTD, Hubei (CN)

( * ) Notice: Subject to any disclaimer, the term of this patent is extended or adjusted under 35 U.S.C. 154(b) by 505 days.

(21) Appl. No.: 16/303,147

(22) PCT Filed: Aug. 22, 2018

(86) PCT No.: PCT/CN2018/101652
§ 371 (c)(1),
(2) Date: Nov. 20, 2018

(87) PCT Pub. No.: WO2020/019388
PCT Pub. Date: Jan. 30, 2020

(65) Prior Publication Data
US 2021/0226155 A1    Jul. 22, 2021

(30) Foreign Application Priority Data
Jul. 25, 2018    (CN) .......................... 201810824342.3

(51) Int. Cl.
*H01L 51/52*    (2006.01)
*H01L 27/32*    (2006.01)

(52) U.S. Cl.
CPC ...... *H01L 51/5228* (2013.01); *H01L 27/3276* (2013.01); *H01L 27/3246* (2013.01); *H01L 51/5246* (2013.01)

(58) Field of Classification Search
CPC ............. H01L 51/5228; H01L 51/5246; H01L 27/3276; H01L 27/3246
See application file for complete search history.

(56) References Cited

U.S. PATENT DOCUMENTS 9,793,508 B2 * 10/2017 Wang ................... H01L 51/5228
9,859,521 B2 *  1/2018 Li ......................... H01L 51/0097
(Continued)

FOREIGN PATENT DOCUMENTS

| CN | 1638556 A | 7/2005 |
| CN | 103824964 A | 5/2014 |

(Continued)

*Primary Examiner* — Lex H Malsawma
(74) *Attorney, Agent, or Firm* — Soroker Agmon Nordman

(57) ABSTRACT

Provided are a display module and an electronic device. The display module includes an array substrate and an encapsulation layer disposed opposite to the array substrate, and the encapsulation layer includes an auxiliary electrode layer and a first electrical connector between the encapsulation layer and the array substrate; wherein the first electrical connector is used to support the encapsulation layer and is electrically connected to the auxiliary electrode layer and the cathode layer.

15 Claims, 3 Drawing Sheets

(56) References Cited

U.S. PATENT DOCUMENTS

| | | | |
|---|---|---|---|
| 10,566,568 B2 * | 2/2020 | Sun | H01L 27/329 |
| 2005/0140290 A1 | 6/2005 | Park et al. | |
| 2014/0138631 A1 | 5/2014 | Chung | |
| 2016/0035803 A1 * | 2/2016 | Kim | H01L 27/326 |
| | | | 257/40 |
| 2016/0035980 A1 * | 2/2016 | Kong | H01L 51/5228 |
| | | | 257/40 |
| 2016/0233458 A1 * | 8/2016 | Shen | H01L 27/3211 |
| 2018/0331169 A1 | 11/2018 | Nam et al. | |
| 2019/0067390 A1 | 2/2019 | Gao | |
| 2019/0165063 A1 * | 5/2019 | Lee | H01L 27/3246 |

FOREIGN PATENT DOCUMENTS

| | | |
|---|---|---|
| CN | 106803547 A | 6/2017 |
| CN | 107039491 A | 8/2017 |
| CN | 107342370 A | 11/2017 |
| CN | 107565048 A | 1/2018 |

* cited by examiner

DISPLAY MODULE AND ELECTRONIC DEVICE WITH AUXILIARY ELECTRODE LAYER ON CATHODE LAYER

FIELD OF THE INVENTION

The present invention relates to a display field, and more particularly to a display module and an electronic device.

BACKGROUND OF THE INVENTION

In the flat panel display technology, the Organic Light-Emitting Diode (OLED) display possesses many advantages such as light and thin, active illumination, fast response, large viewing angle, wide color gamut, high brightness and low power consumption, and gradually becomes the third generation display technology after the LCD. Compared with LCD (Liquid Crystal displays), OLEDs have the advantages of more power saving, thinner, and wider viewing angle, which is not comparable by LCD. At present, people are increasingly demanding the level of display detail, i.e., the resolution but the production of high-quality, high-resolution OLED displays still faces tons of challenges.

In the prior art, an OLED display includes an anode, a light emitting layer on the anode and a cathode on the light emitting layer; wherein the cathode is different from the anode, and the cathode needs to provides a common voltage to all the pixels. Namely, the cathode is a common electrode electrically connected to all the pixels.

In the larger display of the prior art, since the cathode is disposed in the entire layer of the OLED display, the wire resistance is increased, thereby generating a voltage drop and resulting in uneven illumination and increased power consumption; therefore, the OLED display of the prior art further includes an auxiliary electrode layer located on the cathode, which is mainly used to prevent the voltage drop of the cathode; thus, no matter the bottom light emitting type display or the top light emitting type display, the auxiliary electrode layer is mainly used to make the cathode voltages uniform throughout the display; namely, the more uniform the cathode voltages are, the more uniform the brightness/color displays of the OLED display become.

Since the process of the auxiliary electrode layer is implemented after the light emitting layer, the process of the auxiliary electrode layer influences the light emitting layer. For instance, the environment conditions, such as the temperature at which the auxiliary electrode layer is prepared may shorten the lifetime of the light emitting element in certain degree and may destroy or age the light emitting layer, thereby reducing the luminous efficiency and lifetime of the display.

Therefore, there is a need for a display module to solve the above problems.

SUMMARY OF THE INVENTION

The present invention provides a display module and an electronic device to solve the technical problem that the light emitting layer of the OLED display panel of the prior art is damaged.

To solve the aforesaid problem, the technical solution provided by the present invention is described as follows:

the present invention provides a display module, comprising:

an array substrate;

a pixel definition layer and a light emitting element layer on the array substrate, wherein the light emitting element layer comprises an anode layer, a light emitting layer on the anode layer and a cathode layer on the light emitting layer, and the cathode layer covers the pixel definition layer and the light emitting layer;

an encapsulation layer on the pixel definition layer, wherein the encapsulation layer is disposed opposite to the array substrate, and the encapsulation layer comprises an auxiliary electrode layer, and wherein the auxiliary electrode layer comprises first openings, and each of the first openings corresponds to a pixel unit on the light emitting element layer; and a first electrical connector between the encapsulation layer and the pixel definition layer, wherein the first electrical connector is located on the pixel definition layer;

wherein the first electrical connector is used to support the encapsulation layer and is electrically connected to the auxiliary electrode layer and the cathode layer.

In the display module of the present invention, the first electrical connector comprises a first connector, and the first connector is made of a conductive material.

In the display module of the present invention, the first electrical connector comprises a first connector and a second connector, and the first connector is located on a surface of the second connector; and wherein the first connector is made of a conductive material, and the second connector is made of an insulation material.

In the display module of the present invention, the first electrical connector is located on the pixel definition layer and is in contact with the pixel definition layer.

In the display module of the present invention, the first electrical connector is located on the cathode layer and is in contact with the cathode layer.

In the display module of the present invention, the auxiliary electrode layer is located between the encapsulation layer and the first electrical connector; or the auxiliary electrode layer is located inside the encapsulation layer.

The present invention further provides a display module, comprising:

an array substrate;

a pixel definition layer and a light emitting element layer on the array substrate, wherein the light emitting element layer comprises an anode layer, a light emitting layer on the anode layer and a cathode layer on the light emitting layer, and the cathode layer covers the pixel definition layer and the light emitting layer;

an encapsulation layer on the pixel definition layer, wherein the encapsulation layer is disposed opposite to the array substrate, and the encapsulation layer comprises an auxiliary electrode layer; and a first electrical connector between the encapsulation layer and the pixel definition layer, wherein the first electrical connector is located on the pixel definition layer;

wherein the first electrical connector is used to support the encapsulation layer and is electrically connected to the auxiliary electrode layer and the cathode layer.

In the display module of the present invention, the first electrical connector comprises a first connector, and the first connector is made of a conductive material.

In the display module of the present invention, the first electrical connector comprises a first connector and a second connector, and the first connector is located on a surface of the second connector; and wherein the first connector is made of a conductive material, and the second connector is made of an insulation material.

In the display module of the present invention, the first electrical connector is located on the pixel definition layer and is in contact with the pixel definition layer.

In the display module of the present invention, the first electrical connector is located on the cathode layer and is in contact with the cathode layer.

In the display module of the present invention, the auxiliary electrode layer is located between the encapsulation layer and the first electrical connector; or the auxiliary electrode layer is located inside the encapsulation layer.

The present invention further provides an electronic device, comprising the aforesaid display module.

In the electronic device of the present invention, the electronic device further comprises a second electrical connector located between the auxiliary electrode layer and the array substrate;

wherein the second electrical connector is disposed in a non-light emitting region of an outer frame region of the electronic device, and the second electrical connector is electrically connected to the auxiliary electrode layer.

In the electronic device of the present invention, the electronic device further comprises a bonding pad on the array substrate and a metal trace between the bonding pad and the second electrical connector, wherein the bonding pad is electrically connected to the second electrical connector through the metal trace.

The benefits are: the present invention prevents the damage of the light emitting layer by providing the auxiliary electrode layer on the encapsulation layer, which is electrically connected to the cathode layer through the first electrical connector, so that the voltage of the cathode layer is uniform and stable to improve the display result of the display module.

BRIEF DESCRIPTION OF THE DRAWINGS

In order to more clearly illustrate the embodiments of the present invention and the prior art, the following figures will be described in the embodiments and the prior art are briefly introduced. It is obvious that the drawings are only some embodiments of the present invention, those of ordinary skill in this field can obtain other figures according to these figures without paying the premise.

DETAILED DESCRIPTION OF PREFERRED EMBODIMENTS

Figure 1:
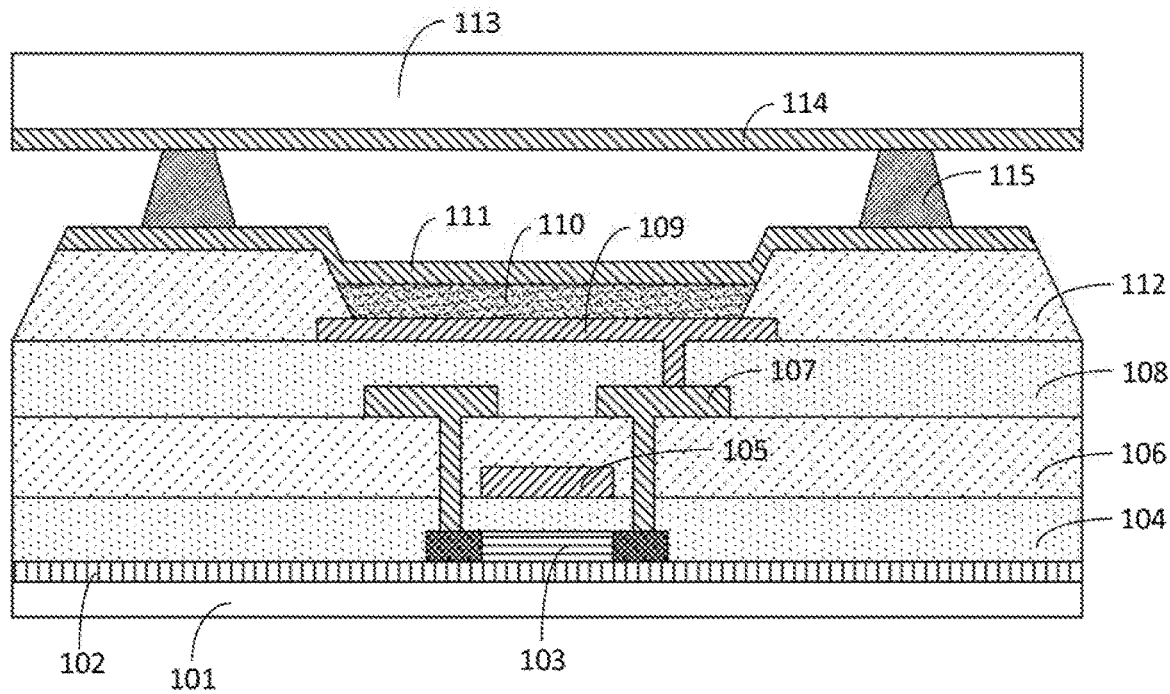
FIG. 1 is a layer structural diagram of a display module according to the first embodiment of the present invention.

The following descriptions for the respective embodiments are specific embodiments capable of being implemented for illustrations of the present invention with referring to appended figures. The terms of up, down, front, rear, left, right, interior, exterior, side, etcetera are merely directions of referring to appended figures. Thus, the used directional terms are used to describe and understand the present invention, but the present invention is not limited thereto. In the figure, units with similar structures are denoted by the same reference numerals.

FIG. 1 is a layer structural diagram of a display module according to the first embodiment of the present invention. The display module comprises an array substrate, a light emitting element layer on the array substrate and an encapsulation layer 113 on the light emitting element layer.

The array substrate includes a substrate 101 and a thin film transistor layer on the substrate 101. The material of the substrate 101 may be one of a glass substrate, a quartz substrate, a resin substrate and the like.

The thin film transistor layer includes an ESL (etching stopper layer type), a BCE (back channel etching type) or a top-gate (top gate thin film transistor type) structure, and has no specific restrictions; for instance, the top-gate thin film transistor type includes: a buffer layer 102, an active layer 103, a gate insulating layer 104, a gate layer 105, an interlayer insulating layer 106, a source drain layer 107 and a planarization layer 108.

The light emitting element layer includes an anode layer 109, a light emitting layer 110 on the anode layer 109 and a cathode layer 111 on the light emitting layer 110;

The anode layer 109 is formed on the planarization layer 108, and the anode layer 109 includes at least two anodes arranged in an array, and the anode layer 109 is mainly used to provide holes for absorbing electrons; in this embodiment, the light emitting element (OLED) is a top emission type OLED element, and the light emitting element is a white light emitting OLED element that emits white light. Therefore, the anode layer 109 is a non-transparent light blocking layer.

The light emitting layer 110 is formed on the anode layer 109, and the light emitting layer 110 is divided into a plurality of light emitting units by the pixel definition layer 112. Each of the light emitting units corresponding to one of the anodes; the holes generated by the anode layer 109 absorb the electrons generated by the cathode layer 111, and a light source is generated in the light emitting layer 110.

The cathode layer 111 is formed on the light emitting element layer, and the cathode layer 111 covers the light emitting layer 110 and the pixel definition layer 112 on the array substrate; in this embodiment, the cathode layer 111 is a transparent material, so that the light generated by the light emitting layer 110 is projected outward through the cathode layer 111.

The encapsulation layer 113 is disposed opposite to the array substrate, and the encapsulation layer 113 is used to protect the layer structure between the encapsulation layer 113 and the substrate 101; wherein the encapsulation layer 113 further includes an auxiliary electrode layer 114, and the auxiliary electrode layer 114 is located between the encapsulation layer 113 and the cathode layer 111 or inside the encapsulation layer 113.

Besides, the display module further includes a first electrical connector 115 between the encapsulation layer 113 and the pixel definition layer 112, and the first electrical connector 115 is located on the pixel definition layer 112; wherein the first electrical connector 115 is used to support the encapsulation layer 113 and is electrically connected to the auxiliary electrode layer 114 and the cathode layer 111.

As shown in FIG. 1, the auxiliary electrode layer 114 is located on the surface of the encapsulation layer 113, that is, the auxiliary electrode layer 114 is integrated with the lower surface of the encapsulation layer 113, and is directly bonded to the array substrate to accomplish the bonding process of the display module.

It can be understood that in the present embodiment, the auxiliary electrode layer 114 is directly integrated at the lower surface of the encapsulation layer 113, and the formation of the auxiliary electrode layer 114 is conducted in the process of forming the encapsulation layer 113, thereby avoiding the effect of the high temperature process of forming the auxiliary electrode layer 114 to the light emitting layer for improving the display result.

In this embodiment, the first electrical connector 115 comprises a first connector, and the first connector is made of a conductive material; namely, the auxiliary electrode layer 114 is electrically connected to the cathode layer 111 through the first electrical connector 115 to provide a stable voltage to the cathode layer 111.

Preferably, the first electrical connector 115 may be made of an organic conductive polymer material doped with a conjugated bond or a conductive carbon material, such as graphene and other transparent conductive or opaque conductive materials.

It can be understood that because the auxiliary electrode layer 114 is disposed in a whole layer, thus the light emitted by the light emitting area of the display module may be blocked by the auxiliary electrode layer; therefore, the auxiliary electrode layer 114 in this embodiment is selected to be transparent metal layer to avoid the reduction of the light emitting efficiency of the display module.

Preferably, a material of the auxiliary electrode layer 114 is indium tin oxide (ITO).

Figure 2:
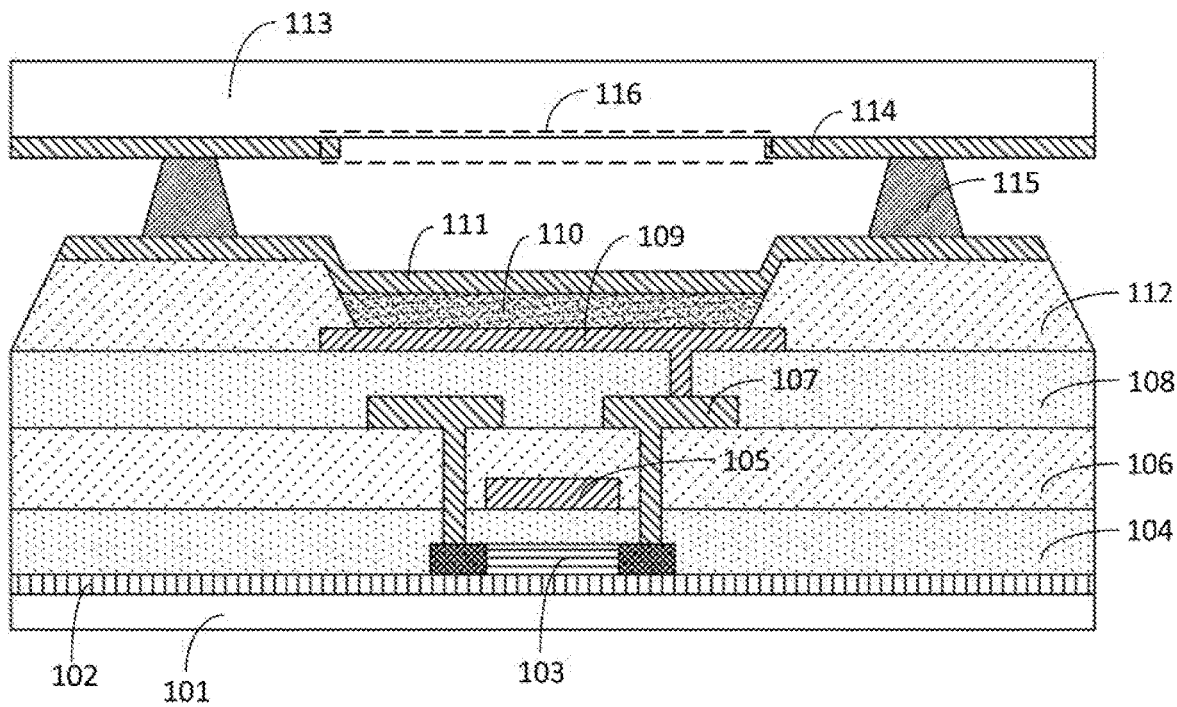
FIG. 2 is a layer structural diagram of a display module according to the second embodiment of the present invention.

FIG. 2 is a layer structural diagram of a display module according to the second embodiment of the present invention. The auxiliary electrode layer 114 comprises first openings 116, and each of the first openings 116 corresponds to a pixel unit on the light emitting element layer; compared with FIG. 1, the auxiliary electrode layer 114 in this embodiment comprises a plurality of first openings 116, so that the light emitted by the light emitting layer 110 is not blocked by the auxiliary electrode layer 114; thus, the material of the auxiliary electrode layer 114 in this embodiment is not specifically limited, such as molybdenum, aluminum or the like.

Figure 3:
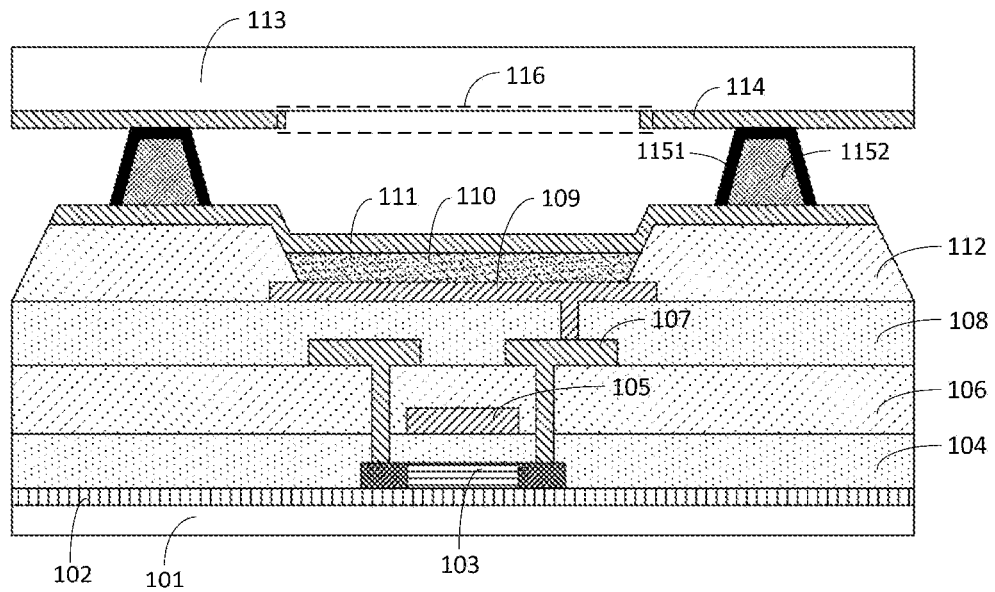
FIG. 3 is a layer structural diagram of a display module according to the third embodiment of the present invention.

FIG. 3 is a layer structural diagram of a display module according to the third embodiment of the present invention. The first electrical connector 115 comprises a first connector 1151 and a second connector 1152, and the first connector 1151 is located on a surface of the second connector 1152; and wherein the first connector 1151 is made of a conductive material, and the second connector 1152 is made of an insulation material.

It can be understood that the first electrical connector 115 is located on the cathode layer 111 and is in contact with the cathode layer 111 as compared with the second embodiment; namely, in this embodiment, a conductive material is disposed on a surface of the second connector 1152, and the auxiliary electrode layer 114 is electrically connected to the cathode layer 111 through the conductive material; preferably, the second connector 1152 may be made of a polymer material having a certain elasticity, and the material of the first connector 1151 has no specific restrictions.

Figure 4:
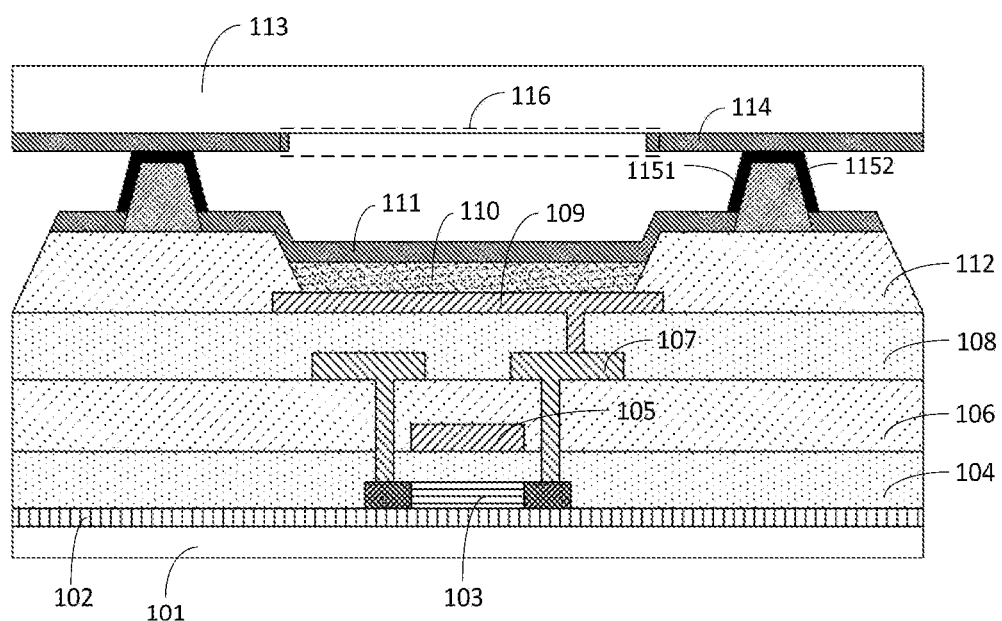
FIG. 4 is a layer structural diagram of a display module according to the fourth embodiment of the present invention.

FIG. 4 is a layer structural diagram of a display module according to the fourth embodiment of the present invention. The first electrical connector 115 in this embodiment is located on the pixel definition layer 112 and is in contact with the pixel definition layer 112.

Compared with the third embodiment, the process of this embodiment is simpler. Namely, the second connector 1152 and the pixel definition layer 112 can be prepared through one photomask. For instance, as the raw material of the second connector 1152 and the pixel definition layer 112 is a photoresist material, the pattern in FIG. 4 is formed by using a multi-tone mask;

Besides, the cathode layer 111 and the first connector 1151 can also be prepared by the same metal layer in one photomask process, which greatly simplifies the process and improves the process efficiency.

In the foregoing first embodiment to fourth embodiment, the auxiliary electrode layer 114 is disposed inside the encapsulation layer 113, and is electrically connected to the first electrical connector 115 through the opening, and is electrically connected to the cathode layer 111 to provide a stable voltage to the cathode layer 111.

In the display module of the present invention, since the auxiliary electrode layer 114 is disposed inside the encapsulation layer 113 or on the inner surface of the same, the auxiliary electrode layer will not damage OLED display light emitting elements or reduce the influence to the same; second, the auxiliary electrode layer 114 is electrically connected to the light emitting layer 110 through the first electrical connectors 115 evenly distributed in the display, thereby possessing a function of uniformly stabilizing the cathode voltages in the entire display; meanwhile, the auxiliary electrode layer 114 has a large area or a large thickness on the inner surface of the encapsulation layer 113 or is made of a low resistance metal material, the auxiliary electrode layer 114 can possess a lower resistance value for better and more uniform transmission of the cathode signals.

The present invention further provides an electronic device, which includes any one of the display modules of the first embodiment to the fourth embodiment.

Figure 5:
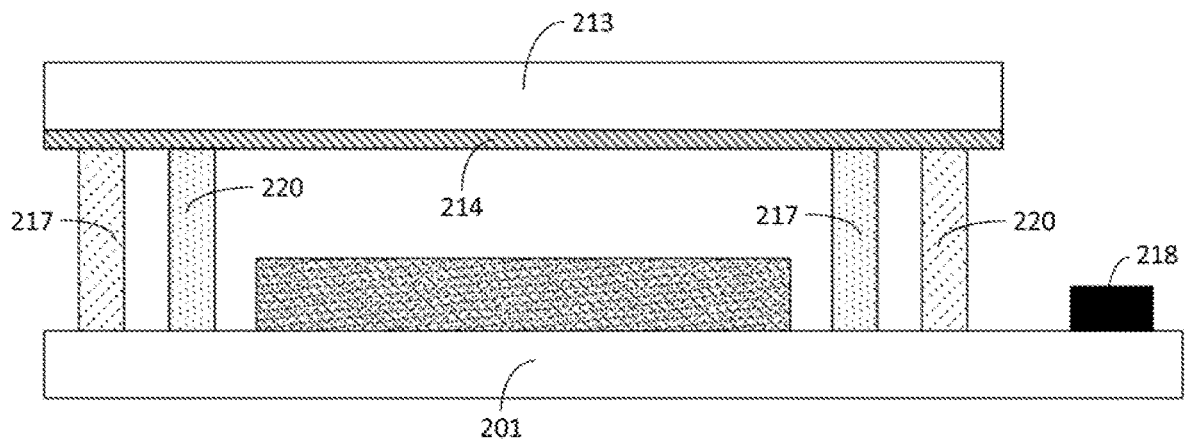
FIG. 5 is a layer structural diagram of an electronic device according to the fifth embodiment of the present invention.

As shown in FIG. 5, the electronic device further includes a second electrical connector 217 located between the auxiliary electrode layer 214 and the array substrate; furthermore, the second electrical connector 217 located between the substrate 201 and the auxiliary electrode layer 214; and wherein the second electrical connector 217 is disposed in a non-light emitting region of an outer frame region of the electronic device, and the second electrical connector 217 is electrically connected to the auxiliary electrode layer 214.

Preferably, the material of the second electrical connection 217 can be silver glue, solder or a metal solidified from a molten state.

In the present embodiment, the electronic device further comprises a bonding pad 218 on the array substrate and a metal trace (not shown) between the bonding pad 218 and the second electrical connector 217. The bonding pad 218 is electrically connected to the second electrical connector 217 through the metal trace.

It can be understood that in the electronic device in this embodiment, the external stable voltages are transmitted to the display module through the pad 218, and are transmitted to the auxiliary electrode layer 214 through the metal trace between the pad 218 and the second electrical connector 217, and the second electrical connector 217, and ultimately transmitted to the cathode layer to ensure that the cathode voltages in the entire display are uniform and stable to improve the display result.

Figure 6:
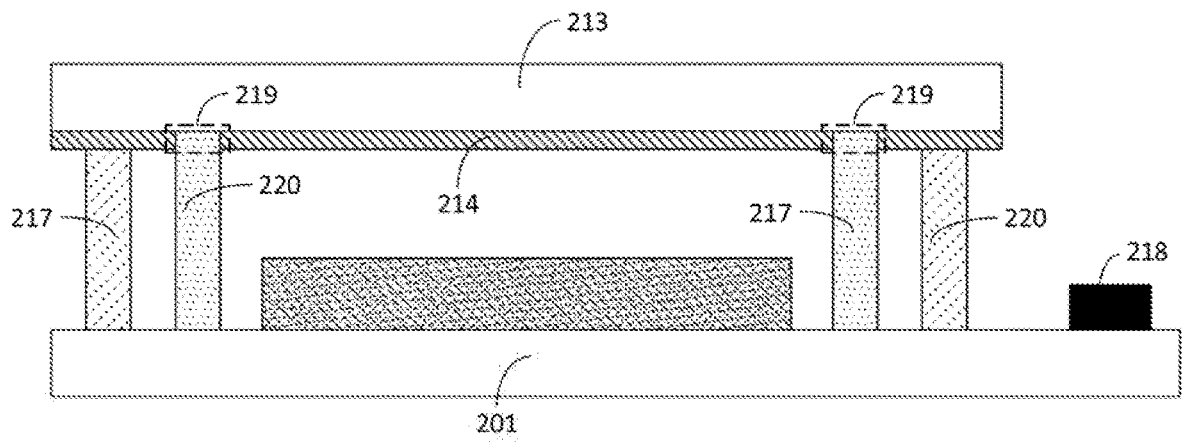
FIG. 6 is a layer structural diagram of an electronic device according to the sixth embodiment of the present invention.

As shown in FIG. 6, in the present embodiment, a plurality of second openings 219 are further disposed in the non-light emitting region of the outer frame, so that the encapsulant 220 of the electronic device is directly connected to the encapsulation layer 213 through the second openings 219 to enhance the sealing property of the encapsulant 220.

It can be understood that the electronic device includes, but is not limited to, a mobile phone, a tablet computer, a computer display, a game machine, a television, a display screen, a wearable device and other living appliances or household appliances having a display function.

The present invention provides a display module and an electronic device. The display module comprises: an array substrate; a pixel definition layer and a light emitting element layer on the array substrate, wherein the light emitting element layer comprises an anode layer, and the cathode layer covers the pixel definition layer and the light emitting layer; an encapsulation layer disposed opposite to the array substrate, wherein the encapsulation layer comprises an auxiliary electrode layer, a first electrical connector between the encapsulation layer and the pixel definition layer, wherein the first electrical connector is located on the pixel definition layer; wherein the first electrical connector is used to support the encapsulation layer and is electrically connected to the auxiliary electrode layer and the cathode layer. The present invention prevents the damage of the light emitting layer by providing the auxiliary electrode layer on the encapsulation layer, which is electrically connected to the cathode layer through the first electrical connector, so that the voltage of the cathode layer is uniform and stable to improve the display result of the display module.

In summary, although the above preferred embodiments of the present invention are disclosed, the foregoing preferred embodiments are not intended to limit the invention, those skilled in the art can make various kinds of alterations and modifications without departing from the spirit and scope of the present invention. Thus, the scope of protection of the present invention is defined by the scope of the claims.

What is claimed is:

1. A display module, comprising:
   an array substrate;
   a pixel definition layer disposed on the array substrate and provided with a via hole;
   a light emitting element layer comprises an anode layer disposed in the via hole, a light emitting layer disposed on the anode layer,. and a cathode layer covering the pixel definition layer and the light emitting layer;
   an encapsulation layer disposed opposite to the array substrate, facing the pixel definition layer, and comprising an auxiliary electrode layer; and
   a first electrical connector disposed between the encapsulation layer and the pixel definition layer, configured to support the encapsulation layer, and comprising a first connector and a second connector, wherein the second connector is directly disposed on a surface of the pixel definition layer away from the array substrate, the second connector and the pixel definition layer are made of a same insulation material, the first connector only covers a surface of the second connector, both ends of the first connector directly physically contacts the cathode layer, the first connector and the cathode layer are made of a same conductive material, and a surface of the first connector away from the second connector directly physically contacts the auxiliary electrode layer.

2. The display module according to claim 1, wherein the conductive material is a metal material.

3. The display module according to claim 1, wherein the insulation material is a photoresist material.

4. The display module according to claim 1, wherein the second photomask is a multi-tone mask.

5. The display module according to claim 1, wherein the auxiliary electrode layer is the outermost layer of the encapsulation layer facing the first electrical connector.

6. The display module according to claim 1, wherein
   the auxiliary electrode layer is located inside the encapsulation layer, the encapsulation layer is provided with a second opening exposing the auxiliary electrode layer, and the first electrical connector directly physically contacts the auxiliary electrode layer through the second opening.

7. The display module according to claim 1, wherein the auxiliary electrode layer is provided with a first opening corresponding to the light emitting layer.

8. The display module according to claim 7, wherein the conductive material is a metal material.

9. The display module according to claim 7, wherein the insulation material is a photoresist material.

10. The display module according to claim 7, wherein the second photomask is a multi-tone mask.

11. The display module according to claim 7, wherein the auxiliary electrode layer is the outermost layer of the encapsulation layer facing the first electrical connector.

12. The display module according to claim 7, wherein
    the auxiliary electrode layer is located inside the encapsulation layer, the encapsulation layer is provided with a second opening exposing the auxiliary electrode layer, and the first electrical connector directly physically contacts the auxiliary electrode layer through the second opening.

13. An electronic device, comprising the display module according to claim 1.

14. The electronic device according to claim 13, further comprising a second electrical connector located between the auxiliary electrode layer and the array substrate, disposed in a non-light emitting region of an outer frame region of the electronic device, and electrically connected to the auxiliary electrode layer.

15. The electronic device according to claim 14, further comprising a bonding pad on the array substrate and a metal trace between the bonding pad and the second electrical connector, wherein the bonding pad is electrically connected to the second electrical connector through the metal trace.

* * * * *